(12) United States Patent
Ting et al.

(10) Patent No.: US 8,222,113 B2
(45) Date of Patent: Jul. 17, 2012

(54) METHOD OF FORMING MOS DEVICE

(75) Inventors: Shyh-Fann Ting, Tainan (TW);
Shih-Chieh Hsu, Hsinchu (TW);
Cheng-Tung Huang, Kaohsiung (TW);
Chih-Chiang Wu, Taichung (TW);
Wen-Han Hung, Kaohsiung (TW);
Meng-Yi Wu, Kaohsiung Hsien (TW);
Li-Shian Jeng, Taitung (TW);
Chung-Min Shih, Tainan (TW);
Kun-Hsien Lee, Tainan (TW);
Tzyy-Ming Cheng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 129 days.

(21) Appl. No.: 12/469,135

(22) Filed: May 20, 2009

(65) Prior Publication Data
US 2009/0239347 A1 Sep. 24, 2009

Related U.S. Application Data

(62) Division of application No. 11/966,734, filed on Dec. 28, 2007, now abandoned.

(51) Int. Cl.
*H01L 21/336* (2006.01)

(52) U.S. Cl. .. 438/300; 438/285; 438/303; 257/E21.546

(58) Field of Classification Search .................. 257/384, 257/192, 616, E21.409, E21.546, E29.255; 438/296, 435, 285, 590, 300, 301, 303
See application file for complete search history.

(56) References Cited

U.S. PATENT DOCUMENTS

| 6,274,894 B1* | 8/2001 | Wieczorek et al. | 257/192 |
| 2004/0067631 A1 | 4/2004 | Bu et al. | |
| 2007/0196987 A1* | 8/2007 | Chidambarrao et al. | 438/285 |
| 2008/0119025 A1* | 5/2008 | Kwon et al. | 438/285 |
| 2009/0039442 A1* | 2/2009 | Han et al. | 257/384 |
| 2009/0140351 A1* | 6/2009 | Lin et al. | 257/407 |

FOREIGN PATENT DOCUMENTS

| TW | 200625636 | 7/2006 |
| TW | I288472 | 10/2007 |
| TW | 200802625 | 1/2008 |

* cited by examiner

*Primary Examiner* — Matthew Landau
*Assistant Examiner* — Colleen E Snow
(74) *Attorney, Agent, or Firm* — WPAT., P.C.; Justin King

(57) ABSTRACT

A method for forming a metal-oxide-semiconductor (MOS) device includes at least steps of forming a pair of trenches in a substrate at both sides of a gate structure, filling the trenches with a silicon germanium layer by a selective epitaxy growth process, forming a cap layer on the silicon germanium layer by a selective growth process, and forming a pair of source/drain regions by performing an ion implantation process. Hence, the undesirable effects caused by ion implantation can be mitigated.

13 Claims, 3 Drawing Sheets

METHOD OF FORMING MOS DEVICE

CROSS-REFERENCE TO RELATED APPLICATION

This application is a divisional application of and claims the priority benefit of an application Ser. No. 11/966,734, filed Dec. 28, 2007. The entirety of the above-mentioned patent application is hereby incorporated by reference herein and made a part of this specification.

BACKGROUND OF THE INVENTION

1. Field of Invention

The present invention relates to a manufacture method of forming semiconductor device. More particularly, the present invention relates to a manufacture method of forming semiconductor device with improved characteristics.

2. Description of Related Art

The metal-oxide-semiconductor (MOS) transistor is one of the most important devices widely applied for very-large-scale-integration (VLSI) circuits, including logic circuits, microprocessors and memories. In addition to a gate oxide layer and a conductive gate structure, the MOS transistor further includes a source/drain region having dopants with a conductivity type opposite to that of the substrate.

With the rapid developments of electronic products e.g. telecommunication products, operating speed of transistors is bound to increase. However, due to the limitations in mobility of electrons and holes in silicon, the applications of the transistors are confined.

The prior art has proposed using silicon germanium (SiGe) epitaxy material as a major component of the source/drain region of the transistor. As compared with silicon, germanium has larger atomic volume and applies lateral compressive stress toward the channel region. Thus, mobility of electrons and holes can be enhanced with the source/drain region formed by SiGe, and the device performance can be improved.

At present, selective epitaxy growth (SEG) process is commonly used to form a SiGe layer for the semiconductor manufacturing processes. However, certain issues still exist in the manufacturing processes involving using SEG process, which may downgrade the device performances.

SUMMARY OF THE INVENTION

The invention provides a method of forming a metal-oxide-semiconductor (MOS) device, which can restrain boron channeling effects and alleviating possible damages caused by ion implantation.

As embodied and broadly described herein, the invention provides a method for forming a semiconductor device structure, comprising providing a substrate having at least an isolation structure and forming a gate structure having a pair of spacers on both sidewalls of the gate structure. After forming a pair of trenches in the substrate at both sides of the gate structure, a selective epitaxy growth process is performed to form a silicon germanium (SiGe) layer filling the trenches and then a selective growth process is performed to form a cap layer on the silicon germanium layer. Later, a pair of source/drain regions is formed by performing an ion implantation process and a metal silicide layer is formed on the gate structure and the cap layer in the source/drain regions.

Based on the preferred embodiment, the cap layer includes an amorphous silicon layer and the amorphous silicon layer covers a whole upper surface of the silicon germanium layer. For example, the amorphous silicon layer has a thickness of about 20 angstroms to about 300 angstroms.

Based on the preferred embodiment, the selective epitaxy growth process is in-situ boron doping selective SiGe epitaxy growth process. Moreover, the selective epitaxy growth process and the selective growth process are performed in-situ in the same chamber or performed in the different chambers of the same platform in clusters.

Based on the preferred embodiment, the upper surface of the silicon germanium layer at least substantially levels with or can be slightly higher than the substrate surface.

According to the preferred embodiment, the ion implantation process comprises implanting boron or $BF_2^+$ ions to the silicon germanium layer. Additionally, an annealing process can be further performed after the ion implantation process to active the implanted ions, and the annealing process comprises performing rapid thermal processing or laser-spike annealing.

According to the preferred embodiment, a pair of source/drain extension regions is formed in the substrate at both sides of the gate structure before forming the first spacers. Alternatively, the source/drain extension regions are formed in the substrate at both sides of the gate structure after removing the first spacers and before forming the second spacers.

According to the preferred embodiment, a grade ion implantation process is performed after the selective epitaxy growth process.

For the semiconductor device of the present invention and the manufacture method thereof, because the SiGe layer is covered by the amorphous silicon layer, the upper surface of the source/drain region is higher than the substrate surface and the subsequently formed metal silicide layer thereon is relatively raised. Hence, possible counteracting effect of the tensile stress of the metal silicide toward the compressive stress of the silicon germanium layer is mitigated and the device performance is enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

FIGS. 1A-1F are cross-sectional views of the manufacture processes for forming a semiconductor device structure according to one preferred embodiment of this invention.

Figure 1A:
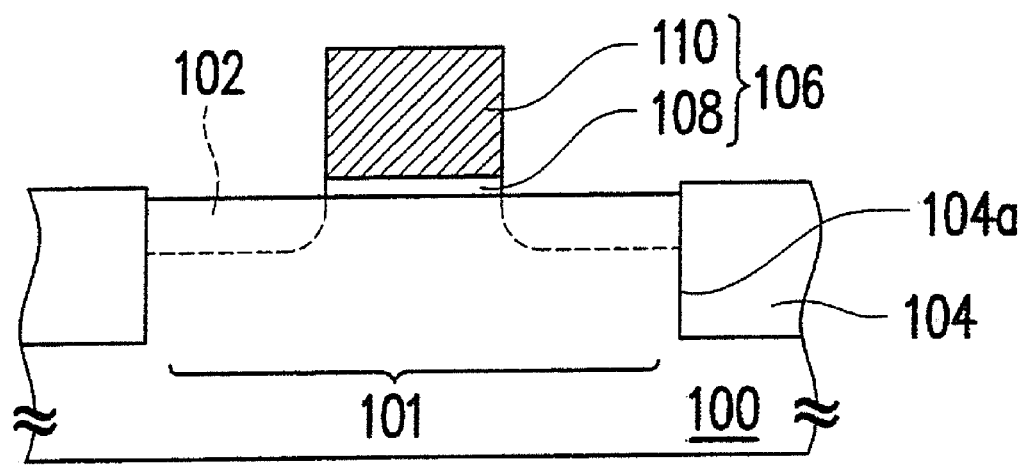
FIGS. 1A-1F are cross-sectional views of the manufacture processes for forming a semiconductor device structure according to one preferred embodiment of this invention.

Referring to FIG. 1A, a substrate 100 e.g. a monocrystalline silicon substrate is provided. A trench 104a is formed in the substrate 100, and an isolation structure 104 is formed in the trench 104a so as to define an active region 101. The isolation structure 104 is made of an insulating material e.g.

silicon oxide and is formed by performing a chemical vapor deposition process, for example.

Then, a gate structure 106 is formed on the substrate 100 within the active region 101. The gate structure 106 is composed of a gate dielectric layer 108 and a conductive layer 110. Here, the gate structure 106 is formed by forming a dielectric material layer (not shown) on the substrate 100 within the active region 101. The dielectric material layer is made of silicon oxide, for example. Next, a conductive material layer (not shown) is formed on the dielectric material layer to completely cover the substrate 100. The conductive material layer is made of polysilicon or doped polysilicon, for example. Thereafter, a photolithography and etching process is performed to pattern the conductive material layer and the dielectric material layer, so as to form the conductive layer 110 and the gate dielectric layer 108. Afterwards, using the gate structure 106 as the mask, at least a pair of source/drain extension regions 102 is formed in the substrate 100 by performing an ion implantation process. For the P-MOS transistor device, boron or $BF_2^+$ ions are doped into the source/drain extension region 102, for example.

Figure 1B:
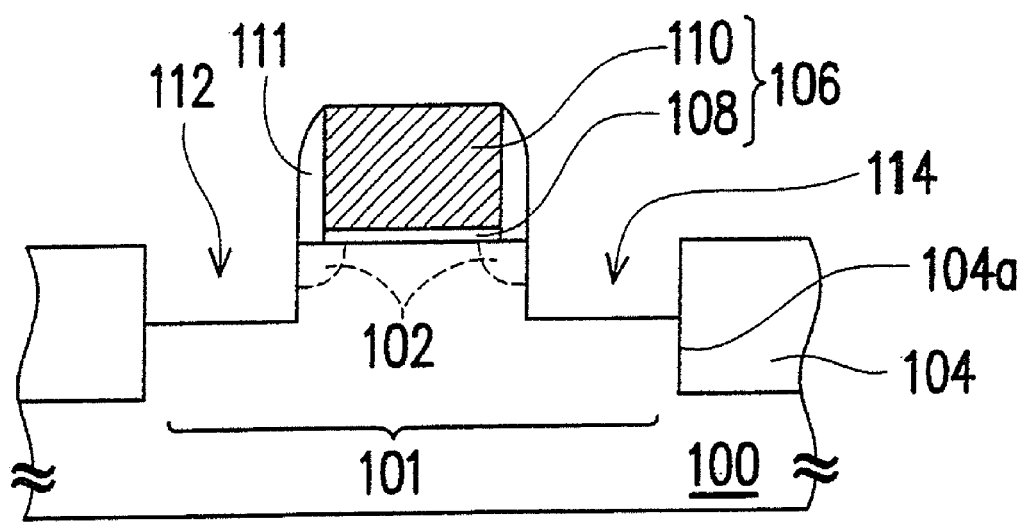

As shown in FIG. 1B, a pair of spacers 111 is formed on the sidewalls of the gate structure 106. Using the gate structure 106 and the spacers 111 as the mask, a pair of trenches 112 and 114 is formed in the substrate 100 at both sides of the gate structure 106 and beside spacers 111. The depth of the trenches 112/114 is about 200-1500 Angstroms, for example.

According to the above embodiment, the source/drain extension regions 102 are formed before forming the trenches 112/114. Nevertheless, the order of the process steps can be re-arranged or switched based on the requirements of the manufacturing processes. Alternatively, the trenches are formed and the source/drain extension regions 102 are formed in the subsequent steps.

Figure 1C:
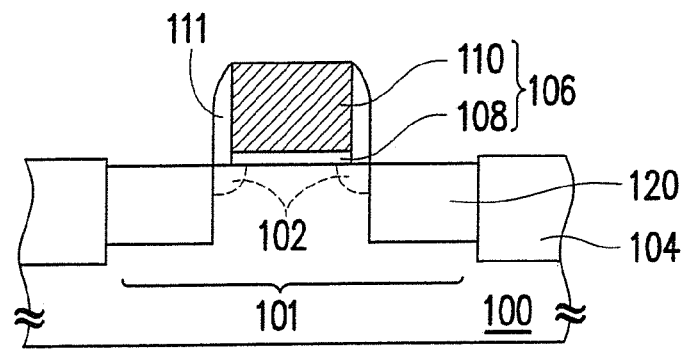

As shown in FIG. 1C, the selective epitaxy growth (SEG) process is performed, by using the silicon containing gas source, to form a silicon germanium ($Si_{1-x}Ge_x$; SiGe) epitaxy layer 120. The SiGe layer 120 fills up the trenches 112 and 114. In this embodiment, the selective epitaxy growth process is the selective SiGe epitaxy growth process, for example, performed under a pressure ranging from 5-50 torrs and a temperature ranging from 550° C. to 750° C. Preferably, the SEG process is, for example, performed at 660° C. in the chemical vapor deposition reaction chamber. The gas source flowed into the reaction chamber includes at least a silicon-containing gas ($SiH_4$, $SiH_3Cl$ or $SiH_2Cl_2$), $GeH_4$ and HCl. For example, a flow rate of silicon-containing gas ranges from 30 sccm to 200 sccm, a flow rate of $GeH_4$ ranges from 50 sccm to 250 sccm, and a flow rate of HCl ranges from 80 sccm to 260 sccm.

According to the preferred embodiment, the SiGe epitaxy layer 120 has a thickness filling up the whole trench 112/114, until the top surface 120a of the SiGe layer 120 substantially levels with the top surface of the substrate 100. Preferably, the top surface 120a of the SiGe layer 120 substantially levels with the top surface of the substrate 100. Depending on the process requirements or performance consideration, the top surface 120a of the SiGe layer 120 may be slightly higher than the top surface of the substrate 100, for example.

For the P-MOS transistor device, the SiGe layer 120 is the strained layer that provides compressive stress along the channel direction for enhancing the mobility of electrons or holes in the channel, thus increasing the driving current and improving the device performance.

Additionally, for the P-MOS transistor device, the selective epitaxy growth process can be, for example, in-situ boron doping selective SiGe epitaxy growth process to directly form boron doping SiGe epitaxy layer. Alternatively, after forming the SiGe epitaxy layer, $P^+$ grade implantation is further performed by implanting e.g. boron ions to about the junction depth for reducing junction resistance. Moreover, the step of $P^+$ grade implantation may be used to dope the polysilicon gate simultaneously.

Figure 1D:
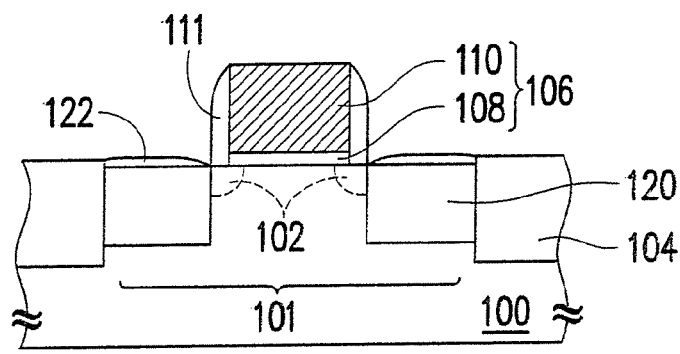

As shown in FIG. 1D, the selective growth process is performed, by using the silicon containing gas source, to form an amorphous silicon layer 122 on the top surface 120a of the SiGe epitaxy layer 120. The amorphous silicon layer 122 covers the whole surface 120a of the SiGe layer 120 and functions as the cap layer. For example, the amorphous silicon layer 122 has a thickness of at least about 20 angstroms, preferably, ranging about 20-300 angstroms.

In this embodiment, the selective growth process is the selective Si growth process, for example, performed under a pressure ranging from 5-80 torrs and a temperature ranging from 650° C. to 1100° C. Preferably, the selective growth process is, for example, performed at 800° C. in the chemical vapor deposition reaction chamber. The gas source flowed into the reaction chamber includes at least a silicon-containing gas ($SiH_4$, $SiH_3Cl$, $SiH_2Cl_2$ or $SiCl_4$) and HCl (or $Cl_2$). For example, a flow rate of silicon-containing gas ranges from 50 sccm to 250 sccm, and a flow rate of HCl or $Cl_2$ ranges from 100 sccm to 300 sccm.

Depending on the throughput or process considerations, the selective epitaxy growth process and the selective growth process can be performed in-situ in the same chamber or performed as cluster in different chamber of the same platform.

Figure 1E:
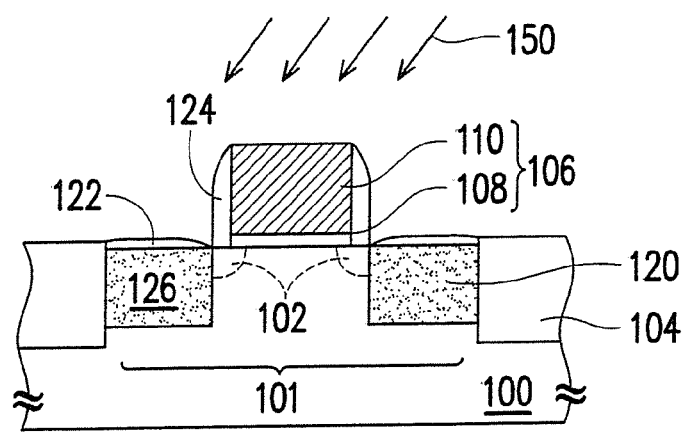

Thereafter, referring to FIG. 1E, the spacers 111 are removed and a pair of spacers 124 is formed on the sidewalls of the gate structure 106. The spacer 124 can be a single spacer structure or double spacer structure, for example. Then, an ion implantation process 150 is performed to form a pair of source/drain regions 126 in the SiGe epitaxy layer 120 within the trenches 112/114 of the substrate 100. For the P-MOS transistor device, boron or $BF_2^+$ ions are doped into the source/drain regions 126, for example. The ion implantation process 150, for example, is performed using boron ions with an energy of about 1 keV and implant dose of $1\times10^{15}$-$5\times10^{15}$ atoms/cm$^2$; or using $BF_2^+$ ions with an energy of about 4 keV and implant dose of $1\times10^{15}$-$5\times10^{15}$ atoms/cm$^2$.

Afterwards, the annealing process is performed to activate the diffusion of dopants to form proper dopant distribution profile. The annealing process can be rapid thermal processing (RTP) or laser-spike annealing (LSA), for example.

According to the above embodiment, the source/drain extension regions 102 are formed before forming the trenches 112/114. Alternatively, in another embodiment, the source/drain extension regions are formed after the formation of the SiGe layer and removal of spacers 111 but before the formation of spacers 124.

Figure 1F:
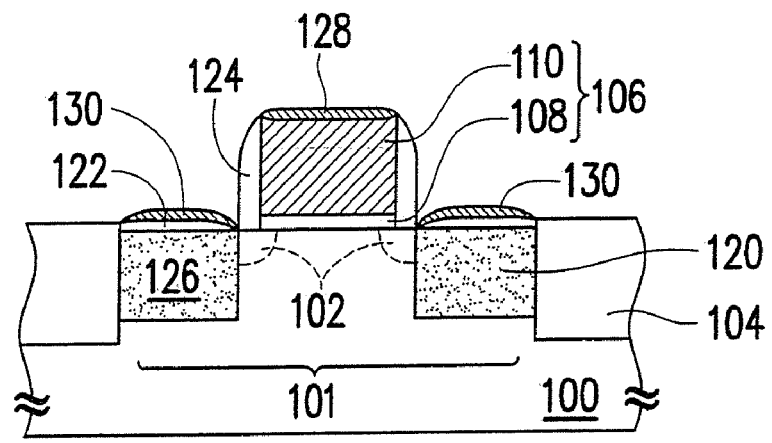

Referring to FIG. 1F, a metal silicide layer 128 is formed on the gate conductive layer 110 and a metal silicide layer 130 is formed on the amorphous silicon layer 122 in the source/drain regions 126 by depositing a metal layer (not shown) over the substrate 100, performing the annealing process allowing the reaction between the metal and silicon, and then selectively removing the un-reacted metal layer. For example, the material of the metal layer can be nickel, platinum or its alloy, while the annealing process can be rapid thermal annealing (RTA). The reaction temperature and time of the annealing process depend on the choice in the material of the metal layer.

Since the amorphous silicon layer 122 covers the SiGe layer 120 as the cap layer, the implanted dopants will collide with the atoms arranged in random in the amorphous silicon layer, thus help relieving the damage to the SiGe layer caused by ion implantation and minimizing the channeling effects of the boron dopants.

According to the preferred embodiment of this invention, because the commonly performed germanium ion implantation (or so-called pre-amorphization implantation; PAI) is omitted and the amorphous silicon layer 122 (as cap layer) is formed to cover the SiGe layer 120, the strain of the SiGe layer 120 will be retained and will not be lessened by germanium ion implantation.

Table 1 shows testing data of three wafers going through different doping processes with other compatible fabrication process steps. Taking the P-type ion implantation as an example, testing results show the impacts of using $P^+$ grade implantation, $B^+$ or $BF_2^+$ source/drain implantation or germanium ion PAI on the stress of the SiGe layer.

TABLE 1

|  | Wafer #20 | Wafer #21 | Wafer #22 |
| --- | --- | --- | --- |
| Epitaxy growth | + | + | + |
| $P^+$ grade implant | + | – | – |
| Ge ion PAI | – | + | – |
| $P^+$-type ion implant ($BF_2^+$) | – | – | + |
| $P^+$-type ion implant ($B^+$) | + | – | – |
| RTP | + | + | + |
| LSA | + | + | + |
| 2 micron-array channel stress | –223 Mpa | –70 Mpa | –270 Mpa |

*compressive stress shown in "–"

As shown in Table 1, wafer #21 having the lowest stress indicates that the step of germanium ion PAI seriously weakens the stress of the SiGe layer. On the other hand, wafer #22 and wafer #20 still have relatively high stress, indicating that the impacts of $P^+$ grade implantation or $B^+/BF_2^+$ implantation on the stress of the SiGe layer are not that decisive.

Figure 2:
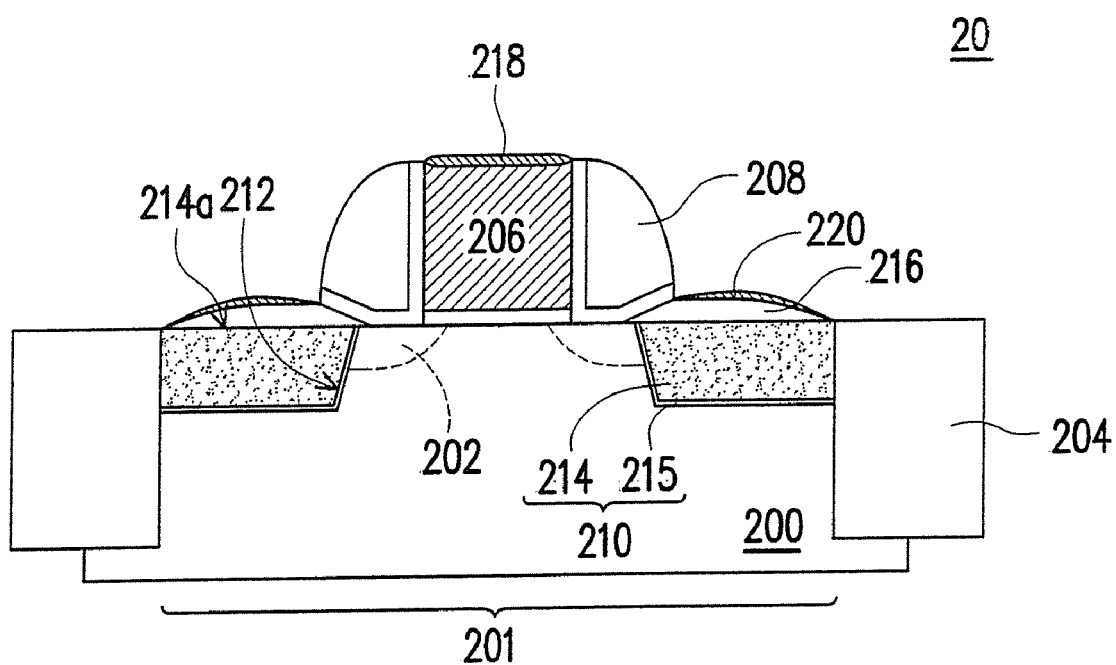
FIG. 2 is a cross-sectional view of a semiconductor device structure according to one preferred embodiment of this invention.

FIG. 2 is a cross-sectional view of a semiconductor device structure according to one preferred embodiment of this invention. The semiconductor device 20 includes at least a substrate 200, an active region 201, source/drain extension regions 202, isolation structures 204, a gate structure 206, spacers 208 and source/drain regions 210. The isolation structures 204 are disposed in the substrate 200 to define the active region 201, while the gate structure 206 is disposed on the substrate 200. The spacers 208 are disposed on sidewalls of the gate structure 206, and the source/drain extension regions 202 are disposed in the substrate 200 at both sides of the gate structure 206.

In FIG. 2, the source/drain region 210 consists of a SiGe epitaxy layer 214 filling up the whole trench 212 in the substrate 200. The SiGe epitaxy layer 214 fills up the whole trench 212 disposed in the substrate 200, until the upper surface 214a of the SiGe layer at least levels with the substrate surface. That is, the upper surface 214a of the SiGe layer 214 either substantially levels with the substrate surface or is slightly higher than the substrate surface. The device 20 further includes an amorphous silicon layer 216 on the SiGe layer 214 and covering the upper surface 214a of the SiGe layer 214. For P-MOS transistor device, the SiGe layer 214 can be a boron doped SiGe layer, for example. The device 20 may further include an undoped SiGe epitaxy layer 215 between the trench 212 and the SiGe layer 214, for strengthening the structure and avoiding boron channeling effects.

Depending on the device designs, the device 20 may further includes a metal silicide layer 218 disposed on the top surface of the gate structure 206 and a metal silicide layer 220 disposed on the amorphous silicon layer 216 in the source/drain regions 210. The material of the metal silicide layer 218/220 may be nickel silicide, nickel platinum silicide or their combinations or alloys, for example.

According to this invention, as the upper surface 214a of the SiGe layer at least levels with the substrate surface and considering the amorphous silicon layer 216 covering the SiGe layer 214, the upper or top surface of the source/drain regions should be higher than the substrate surface. Hence, the subsequently formed metal silicide layer 220 is disposed on the amorphous silicon layer 216 and higher than the substrate surface. Compared with prior structure, the metal silicide layer is somewhat raised, thus relieving the counteracting effect of the tensile stress of the metal silicide layer toward the compressive stress of the SiGe layer. Therefore, the device performance will not be downgraded by the formation of the metal silicide layer.

In addition, the use of the amorphous silicon layer covering on the SiGe layer can mitigate the boron channeling effects to avoid short channel effect. Further, the amorphous silicon layer help to sustain the strain of the underlying SiGe layer and alleviate implant damages in the subsequent doping processes. As a result, not only the device performance but also reliability of the device can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a metal-oxide-semiconductor (MOS) device, comprising:
   providing a substrate having at least an isolation structure;
   forming a gate structure on the substrate;
   forming a pair of first spacers on both sidewalls of the gate structure;
   forming a pair of trenches in the substrate at both sides of the gate structure;
   performing a selective epitaxy growth process to form a silicon germanium (SiGe) layer filling the trenches;
   performing a selective growth process to form an amorphous silicon layer on the silicon germanium layer without a pre-amorphization implantation process;
   removing the first spacers after the amorphous silicon layer is formed;
   forming a pair of second spacers on both sidewalls of the gate structure after the first spacers are removed;
   forming a pair of source/drain regions by performing an ion implantation process with the gate structure and the pair of second spacers as a mask; and
   forming a metal silicide layer on the gate structure and the amorphous silicon layer in the source/drain regions.

2. The method of claim 1, wherein the amorphous silicon layer covers a whole upper surface of the silicon germanium layer.

3. The method of claim 2, wherein the amorphous silicon layer has a thickness of about 20 angstroms to about 300 angstroms.

4. The method of claim 1, wherein the selective epitaxy growth process is in-situ boron doping selective SiGe epitaxy growth process.

5. The method of claim 1, wherein an upper surface of the silicon germanium layer at least substantially levels with the substrate surface.

6. The method of claim 1, wherein the selective epitaxy growth process and the selective growth process are performed in-situ in the same chamber.

7. The method of claim 1, wherein the selective epitaxy growth process and the selective growth process are performed in the different chambers of the same platform in clusters.

8. The method of claim 1, wherein the ion implantation process comprises implanting boron or $BF_2^+$ ions to the silicon germanium layer.

9. The method of claim 8, further comprising performing an annealing process after the ion implantation process to active the implanted ions, wherein the annealing process comprises performing rapid thermal processing or laser-spike annealing.

10. The method of claim 1, further comprising forming a pair of source/drain extension regions in the substrate at both sides of the gate structure before forming the first spacers.

11. The method of claim 1, further comprising forming a pair of source/drain extension regions in the substrate at both sides of the gate structure after removing the first spacers and before forming the second spacers.

12. The method of claim 1, further comprising performing a grade ion implantation process after the selective epitaxy growth process.

13. The method of claim 1, wherein the silicon germanium layer includes a doped SiGe layer and an undoped SiGe layer underlying the doped SiGe layer.

* * * * *